(12) United States Patent
Martinez Canedo et al.

(10) Patent No.: US 9,542,509 B2
(45) Date of Patent: Jan. 10, 2017

(54) CONTEXT-BASED SYNTHESIS OF SIMULATION MODELS FROM FUNCTIONAL MODELS OF CYBER-PHYSICAL SYSTEMS

(71) Applicants: Arquimedes Martinez Canedo, Princeton, NJ (US); Eric Alexander Schwarzenbach, Marblehead, MA (US); Thomas Feichtinger, Monmouth Junction, NJ (US)

(72) Inventors: Arquimedes Martinez Canedo, Princeton, NJ (US); Eric Alexander Schwarzenbach, Marblehead, MA (US); Thomas Feichtinger, Monmouth Junction, NJ (US)

(73) Assignee: Siemens Aktiengesellschaft, Munich (DE)

( * ) Notice: Subject to any disclaimer, the term of this patent is extended or adjusted under 35 U.S.C. 154(b) by 778 days.

(21) Appl. No.: 13/941,845

(22) Filed: Jul. 15, 2013

(65) Prior Publication Data
US 2014/0019104 A1 Jan. 16, 2014

Related U.S. Application Data

(60) Provisional application No. 61/671,945, filed on Jul. 16, 2012.

(51) Int. Cl.
*G06G 7/48* (2006.01)
*G06F 17/50* (2006.01)
(52) U.S. Cl.
CPC .................. *G06F 17/5009* (2013.01)

(58) Field of Classification Search
CPC .................................................. G06F 17/5009
USPC .............................................................. 703/6
See application file for complete search history.

(56) References Cited

PUBLICATIONS

Canedo et al. (inventors; corresponds to invention): Context-sensitive Synthesis of Executable Functional Models of Cyber-Physical Systems; ICCPS'13 Apr. 8-11, 2013, Philadelphia, PA, USA; pp. 99-108.*
Hirtz et al.: A functional basis for engineering design: Reconciling and evolving previous efforts. NIST Technical Note 1447; 2002; 43 pp.*
Gorel Hedin et al: "Extending Languages by Leveraging Compilers: From Modelica to Optimica", IEEE Software, Institute of Electrical and Electronics Engineers, US, vol. 28, No. 3, May 1, 2011; pp. 68-74, XP011354817.

\* cited by examiner

*Primary Examiner* — Hugh Jones

(57) ABSTRACT

An approach and tool integrate cyber-physical systems design based on the function-behavior-state (FBS) methodology where multi-domain simulation models capturing both the behavioral and structural aspects of a system are automatically generated from its functional description. The approach focuses on simulation-enabled FBS models using automatic and context-sensitive mappings of functional basis elementary functions to simulation components described in physical modeling languages. Potentially beneficial process loops are recognized and inserted in the functional model.

22 Claims, 12 Drawing Sheets

ALGORITHM 1 CONTEXT-SENSITIVE SYNTHESIS ALGORITHM

REQUIRE: FUNCTIONAL MODEL $G = (V, E, L_V, L_E)$
REQUIRE: LIBRARY OF SYSTEM-LEVEL SIMULATION COMPONENTS $\mathcal{L}$
REQUIRE: ENGINEERING VIEW $\mathcal{W}$
REQUIRE: RECYCLE FUNCTION RULES $\mathcal{R}$
ENSURE: SYSTEM-LEVEL SIMULATION MODEL $S$ 1: $S = \emptyset$
2: Build AST for each component $c \in \mathcal{L}$
3: if $\mathcal{W} \subseteq G$ then
4:   Create empty (black-box) component $B = \emptyset$
5:   Create map for all flows $e \in E(\mathcal{W})$ and for all functions $v \in V(\mathcal{W})$ to $B$
6:   Create connections in $B$ for all primary and secondary flows from/to $\mathcal{W}$
7:   Add component $B$ to $S$
8:   RESIDUAL = $\mathcal{W} \setminus G$
9:   for each functions $v' \in V$ (residual) do
10:    MATCHES = get list of all MATCHES $m'$ of function-components of $v'$ in AST
11:    MINIMAL = pick component $c$ from MATCHES with the least number of equations and algorithmic statements
12:    Add MINIMAL component to $S$
13:   end for
14: else if $\mathcal{W} = \emptyset$ then
15:   for each functions $v \in V(G)$ build context tree $T$ do
16:    $T$.root = build signature from $l(v)$ and primary inbound/outbound flows $l(e_p)$ to/from $v$
17:    $T$.inner = all possible combinations of secondary flows $l(e_s)$ with $v$
18:    CONTEXT = $T$.root x $T$.inner
19:    $T$.leaf = deduce realization mechanism from CONTEXT
20:    $\forall$ levels $i \in T$ create a path $P_i$ that satisfies function $v$ and flows $e$ connected to $v$
21:    INFERREDDESIGN = find function-to-component and flow-to-component matches for $P_i$ in AST
22:    Add INFERREDDESIGN to $S$
23:   end for
24:   for each rules $r \in \mathcal{R}$ do
25:    if $r$ matches $G$ then
26:     Add function $v'$ with $l(v')$ = recycle to $V(G)$ and feedback flow $f'$ to $E(G)$ from $r.src$ to $v'$ and from $v'$ to $r.dst$
27:     Add energy conservation equations to $S$ using $l(r.src)$ = and $l(r.dst)$ physical domain
28:    end if
29:   end for
30: end if
31: return $S$

FIG. 11

CONTEXT-BASED SYNTHESIS OF SIMULATION MODELS FROM FUNCTIONAL MODELS OF CYBER-PHYSICAL SYSTEMS

CROSS-REFERENCE TO RELATED APPLICATIONS

This application claims priority to U.S. provisional application Ser. No. 61/671,945 filed Jul. 16, 2042, the disclosure of which is incorporated by reference herein in its entirety.

BACKGROUND OF THE INVENTION

1. Technical Field

The present invention relates to the synthesis of simulation models, and more particularly, to techniques for inferring missing information in a functional model, to better map functional basis elementary functions to simulation components.

2. Discussion of the Related Art

Product development, from basic consumer products to complex systems, is facing an unprecedented level of complexity due to the interactions among hundreds to millions of heterogeneous components, tight time-to-market and budget, need for innovation and new services, safety and environmental regulations, and consumer requirements. Although systems engineering methodologies facilitate the intensive cross-domain collaboration in temporally and geographically distributed teams to create better performing products, the main bottleneck in cyber-physical systems (CPS) design still is the difficulty of realizing concurrent engineering where the tasks that occur at the various stages of product development are overlapped in time to reduce errors, cost, and time.

A CPS is a heterogeneous and/or hybrid system that can be geographically distributed and/or integrated within a single form factor to perform control functionality in software to actuate and/or manipulate a physical, chemical, or biological process. In such a system, modern high speed communication plays an important role for integrating the subsystems. As opposed to the traditional mechanical-centric approach where software and control are an afterthought or a last minute effort, an integrated CPS product development relies on cross-discipline modeling and early identification of system-level problems to provide a highly flexible and less expensive approach for creating innovative and truly integrated CPS. Currently, as observed by researchers and practitioners, the main limiting factor in complex industrial CPS development is the lack of tools to support the early concept design phase. It has been estimated that 70-80% of the cost of a product is determined by the decisions taken at that phase. Presently disclosed is a general method and a tool to improve the current practice of early concept CPS design of complex industrial systems including machine tools and robotics, transportation, energy, manufacturing, and nano-/micro-scale implantable medical devices.

Modeling and simulation have become standard practice in the development of complex systems because it is an economical and effective way to design, validate, and test complex systems. Products can be virtually explored and analyzed before they exist in reality because software is used to estimate the dynamic behavior of the system under a large variety of conditions. This, in principle, enables the early identification of system-level problems.

SUMMARY OF THE INVENTION

In an exemplary embodiment of the present invention, there is provided a method for synthesizing a simulation model of a cyber-physical system, based on a functional model of the cyber-physical system. Operations in the method may be executed by a processor. Input flows and output flows of a function included in the functional model of the cyber-physical system are initially identified. Of those input flows and output flows of the function, those that are not inherent to the function are further identified as secondary flows. Using a context provided by the secondary flows, a simulation model component that maps to the function of the functional model is selected. The above operations are then repeated on additional functions included in the functional model to select additional simulation model components.

Selecting a simulation model component that maps to the function of the functional model may further comprise referring to a context tree having a root node corresponding to the function of the functional model. The context tree may also have branch nodes corresponding to the secondary flows of the function, and leaf nodes corresponding to the simulation model components. The branch nodes may be separated into receiving flows and supplying flows.

The method may also include inserting a recycle function in the functional model to return one of a material, an energy flow or a signal to a predecessor function. In that case, the method may also include recognizing a flow out of the cyber-physical system, wherein inserting the recycle function feeds the flow back to the predecessor function.

The method may comprise inserting the recycle function at a location in the functional model; for a resulting functional model containing the recycle function at the location, generating a corresponding simulation model; repeating the inserting and the generating for a plurality of locations; and presenting a plurality of alternative corresponding simulation models to a user. The location for inserting the recycle function in the functional model may be manually selected.

The method may comprise inserting the recycle function at a location in the functional model; for a resulting functional model containing the recycle function at the location, generating a corresponding simulation model; computing a characteristic value of a cyber-physical system modeled by the corresponding simulation model; repeating the inserting, the generating and the computing for a plurality of locations to generate a plurality of simulation models and characteristic values; and choosing a simulation model from the plurality of simulation models based on the characteristic value. The characteristics may be compared using at least one engineering rule.

The recycle function may return a signal to a predecessor function, and creates a control law. The control law may implement a feedback controller.

In another aspect of the invention, non-transitory computer useable media are provided having computer readable instructions stored thereon for execution by a processor to perform operations as described above.

BRIEF DESCRIPTION OF THE DRAWINGS

FIG. 11 is a listing of an algorithm that may be used in conjunction with the model generating tool.

DETAILED DESCRIPTION OF EXEMPLARY EMBODIMENTS

Modeling and simulation have evolved independently on different engineering domains. Coupling different tools for a holistic analysis and multi-domain simulation is very complicated and sometimes not even possible. The present disclosure is based on the concept that integrated CPS design requires a general cross-disciplinary approach capable of characterizing how design changes in one domain affect the rest of the domains in the system and the system-level behavior. The Function-Behavior-State (FBS) methodology is a general framework for system development where functionality, or a discipline-independent description of what the system does, is used to unify the reasoning, communication and understanding between engineers and tools of various disciplines. Functions are related to states (structures or entities and attributes of entities) and behaviors (a change of states over time). States and behaviors are concrete realizations of functions that can, theoretically, be used to simulate the system. Unfortunately, support for the FBS methodology is either limited to in-house tools or heavily focused on fundamental research. An objective of this disclosure is to create a more practical approach and tool based on FBS principles that improves the early concept design, modeling, and simulation of complex industrial systems.

Figure 1:
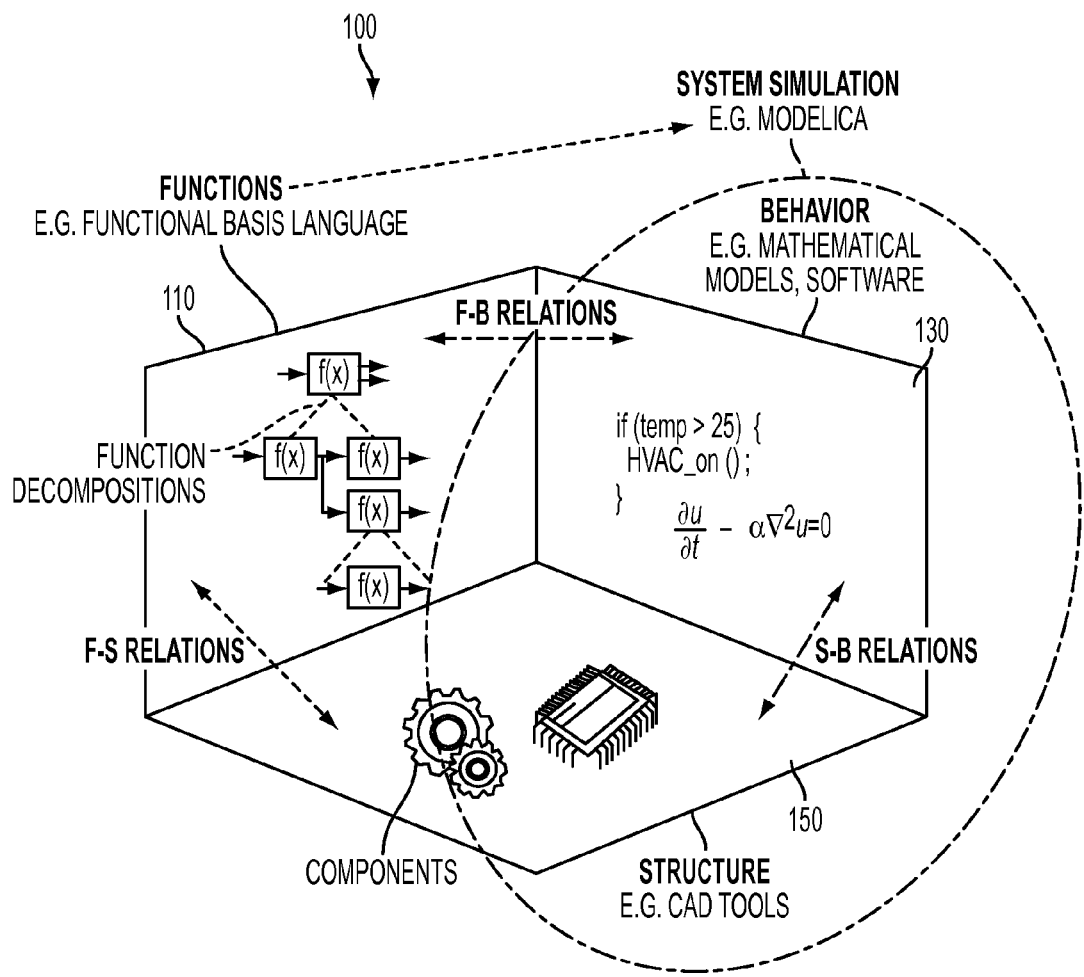
FIG. 1 is a conceptual diagram illustrating the function-behavior-structure methodology, including an exemplary embodiment of the present invention.

The FBS methodology is considered by many researchers and practitioners to be the most adequate approach for developing complex systems from their functional descriptions. The FBS specifies three orthogonal design layers representing functions 110, behavior 130, and state 150 of the system 100, as shown in FIG. 1. The function layer 110 describes the design intentions, functional decomposition, and matter and energy transformations. In the present disclosure, "functional modeling" is referred to as the manipulation of the function layer. The state, or structure, layer 150 defines the physical objects with attributes (e.g. a gear with 10 teeth) that can be used to realize the system functionality. "State" and "structure" are commonly used as synonyms when referring to FBS layers. The behavior layer 130 defines physical phenomena as changes of state, or working principles, that describe the functions and the selected structures. Semantic relations bind the three layers (F-S, S-B, and F-B relations) into a comprehensive view of the system. In the present disclosure, the FBS methodology is followed in combination with systems engineering principles to provide a framework for concept design, product representation, and simulation of complex cyber-physical systems. Specifically, executable structural-behavioral models are created automatically from functional models through the use of system simulation languages.

The different nature of the FBS layers requires various modeling languages and tools. For example, the Functional Basis language has been successfully implemented in authoring tools for function decompositions in the function layer, mechanical and electrical CAD tools have been traditionally used in the structure layer, and software integrated development environments and mathematical equation languages are suitable for the behavior layer. Unfortunately, these tools and languages have remained decoupled and incompatible because each layer must be treated separately using specialized tools. Researchers have proposed the use of SysML, a general purpose modeling language, as a unifying language for the FBS approach, SysML is an extension of UML for systems engineering and supports the various semantics and requirements of the FBS layers. SysML, however, is limited to expressing models and does not specify any mechanism to execute those models.

The existing systems discussed above therefore have several disadvantages. They are not capable of automatically generating system-simulation models from functional models. Instead, functional models are mapped manually to behavior models and to structural models. The existing simulation systems are domain-specific, so multiple simulations cannot be coupled into a system-level simulation because there are fundamental differences such as mathematical incompatibility. Behavior and structural models are furthermore independent models. Each is non-executable.

Because FBS models are static or non-executable, they cannot be used to validate the dynamic behavior of the system. Because the mapping of functions-to-components in existing systems did not use contextualization of functions, the resulting simulations have sub-par performance.

In the present disclosure, executing FBS models is considered essential for the adoption of this methodology in industry. The present disclosure proposes the use of system-level modeling and simulation languages to create executable FBS models.

System simulation languages such as Modelica, Simscape, VHDL-AMS allow the modeling and simulation of multi-disciplinary complex systems. Using a component-based approach where behavior is specified according to energy conservation principles, those languages provide the means for multi-disciplinary modeling and simulation where different engineering domains can be combined in the same language and in the same simulation. As shown in FIG. 1, this is a suitable abstraction for the structure and behavior layers 130, 150 in the FBS modeling approach because those two layers can be unified using the same language rather than using incompatible domain-specific tools. Specifically, the Functional Basis language is used to manipulate the functional layer of FBS representations and the Modelica language is used to provide a consistent representation of structure and behavior layers to obtain simulations. In addition, by using automatic generation of Modelica models from functional models, the creation of function and behavior/structure layers of a system model is streamlined.

The present disclosure focuses on the problem of automatically generating system simulation models from functional models. A novel synthesis method is used to contextualize functions in a functional model according to their surrounding flows to create function-to-component mappings that are comparable in quality to manual selection of components done by experts. Rather than creating behavior and structure models independently and manually mapping functions to behavior and structure, the presently described synthesis tool auto-generates multi-domain Modelica simulation models that capture both the structural and behavioral aspects of a functional model. The presently described technique improves concurrent engineering by allowing cross-functional team collaboration through functional modeling, and significantly reducing the effort associated with manual behavior and structural modeling by automating the creation of multi-domain simulation models suitable for integrated cyber-physical systems design.

The presently disclosed technique provides a practical FBS approach where functional models are automatically translated into behavioral-structural simulation models using physical modeling languages such as Modelica. Traditionally static (non-executable) FBS models are thereby transformed into dynamic (executable) simulation-enabled FBS models that provide an integrated multidisciplinary system simulation that eliminates the problem of simulation tool incompatibility. The resulting system-level simulation capabilities make integrated cyber-physical systems design more efficient.

The synthesis method and tool described below automatically generates high-quality system-level simulation models from functional models based on the contextualization of flows and feedback flows in functional models to improve the functions-to-component selection. A new "recycle" function in the Functional Basis language facilitates the generation of closed loop system-level simulation models, an essential concept for control, software, sensors, and actuators of a cyber-physical system.

Structural and Functional Operation of the Disclosed Tool

Functional Modeling (FM) is a Systems Engineering (SE) activity in which products are described in terms of their functionalities and the functionalities of their subsystems. Fundamentally, a functional model reflects what the system does. Because a Functional Model decouples the design intentions (functions) from behavior and/or structure, it can be used as the basis for communication among engineers of different disciplines. Functional modeling reflects design intentions that are typically driven by product requirements and human creativity. Functional Modeling creates a bird's-eye vie of a system that any person in an organization, regardless of the domain of expertise and responsibility, can understand.

Functional modeling is a creative human exercise acknowledged by many researchers and practitioners to be a subjective process; it is therefore suitable for concept design. Defining a system in terms of its functionality (purpose, intent, or goal) may seem simplistic and unnecessary but this is exactly what improves the systems engineering process by consolidating multiple engineering paradigms (e.g. electrical, mechanical, software, thermal engineering) into a unified system representation. By making explicit the implicit knowledge of the engineers, a functional model exposes the obvious facts about the system that people can easily understand, regardless of their domain of expertise. That improves the communication among different disciplines because it brings the minds of the domain experts to the same level of abstraction that is facilitated by natural language. In FM, specialized knowledge is irrelevant and discouraged. For example, the phrase "transport people" describes the goal of any transportation system and it intentionally ignores the different embodiments such as an automobile, a train, or an airplane. A functional model can also be refined into more specific descriptions in a process referred to as functional decomposition. The "transport people" function can be decomposed into sub-functions such as "navigate airspace" or "navigate highways" selecting the design of an airplane or an automobile. Furthermore, sub-functions can be decomposed creating a functional decomposition tree where the root node represents the top-level function and the leaf nodes represent elementary functions such as "transform chemical energy to mechanical energy."

Formalization of functional modeling is critical for implementing this highly subjective and creative process into the systems engineering practice. The de facto functional modeling syntax is a block flow diagram where a block represents a function (process) with inputs and outputs (flows). An interesting practical problem of functional modeling is that different designers tend to create substantially different functional models of the same system. Some researchers have observed that even the same person tends to create different models of the same system when asked to design the system a second time. An important improvement was the creation of the Functional Basis language, which has well defined syntax and semantics. By using a constrained vocabulary and well-defined function and flow semantics, functional modeling practice can be normalized as different designers can rely on the same language to create and understand systems. The Functional Basis language defines three flow categories ("material," "energy," and "signal") that expand into a total of 18 flow types, and 8 function categories with a total of 32 primitive functions. The functional basis language is used in the present implementation because it is the de facto standard for functional modeling and also to enable compatibility with other tools and methods.

The present disclosure presents a practical approach that uses functional models as the "glue" to maintain consistency between different models and people from different disciplines. In addition, a method is presented for automatically generating dynamic system simulation models from functional models. Inferring a context from a functional model is a key enabling technology for generating high-quality simulation models that can be customized for different purposes including discipline-specific analysis and detailed simulation, trade-off studies of design variants, or a holistic system simulation involving multiple disciplines.

Highly specialized domain-specific modeling languages and simulators have been developed to support particular industries such as very-large-scale integration (VLSI) and robotics. Those tools typically rely on a mathematical modeling approach where behavioral descriptions of the system represented by differential and discrete equations are translated into mathematical models. The main challenge with mathematical modeling is finding the appropriate system of equations to describe the system. Many high-accuracy and robust algorithms are available for the numerical solution of mathematical models, but there is a demand for tools to assist the creation of the mathematical models and the determination of those systems of equations. Moreover, coupling of different mathematical models created by different tools is very complicated due to the inherent differences between engineering domains. Mathematical modeling and simulation are domain-specific approaches and therefore not suitable for multi-domain systems engineering.

When developing a heterogeneous complex system, coupling models and simulation of different engineering disciplines (e.g. mechanical, electrical, software) is desirable because it speeds up the development time, increases the understanding and communication, facilitates design and optimization, and enables virtual prototyping and verification. Physical modeling languages such as bond graphs, Modelica, and Simscape have been developed for interdisciplinary modeling and simulation of complex heterogeneous systems. Physical modeling relies on the interconnection between physical components (i.e. resistor, pump, gear box) that encapsulate behavioral descriptions (mathematical models). Components interact through physical ports while honoring the energy conservation principles using the effort-flow variables such as voltage-current in the electrical domain, temperature-heat flow in the thermal domain, and angular velocity-torque in the rotational mechanics domain. This modeling paradigm based on energy conservation principles couples various disciplines, allows the integration of user-defined disciplines, and facilitates model reusability. Because each component defines a behavioral model using energy conservation principles, physical models can be translated into compatible mathematical models and numerically solved in a holistic simulation.

Physical modeling enables system-level simulation of the various subsystems and disciplines in a complex heterogeneous system. This is beneficial for the systems engineering process because it provides a unified system model that engineers can use throughout the various stages of development. Currently, system-level simulation models are manually created and maintained by experts, making it a lengthy and error-prone process. The present disclosure demonstrates how functional models can be used to automatically generate system-level simulation models according to the latest engineering specifications. This not only eliminates the manual effort, but creates a more efficient concept design phase where engineers are allowed to try alternative designs at the functional level and to obtain the corresponding system-level simulation models automatically. Although the Modelica language is used as an example in the following discussion, the method is general to functional modeling and system simulation and can be easily adapted to other physical modeling languages.

Finding components to fulfill the functionalities of a system under certain constraints is one of the fundamental principles in engineering, and requires domain-specific knowledge, experience, and creativity. Any tool that attempts to automate that process must produce simulation models that are comparable in terms of detail and quality to models created by system simulation experts. The "quality" of a simulation refers to accuracy, fidelity and correctness. This is a challenging requirement because one function may be realized by multiple and different components, and one component may realize multiple functions. In other words, multiple valid simulation models exist for a given functional model, but only a few are useful for modeling the actual system. In the following discussion, it is recognized that a functional model is inherently incomplete and therefore insufficient to reliably generate high-quality and relevant simulation models.

Figure 2:
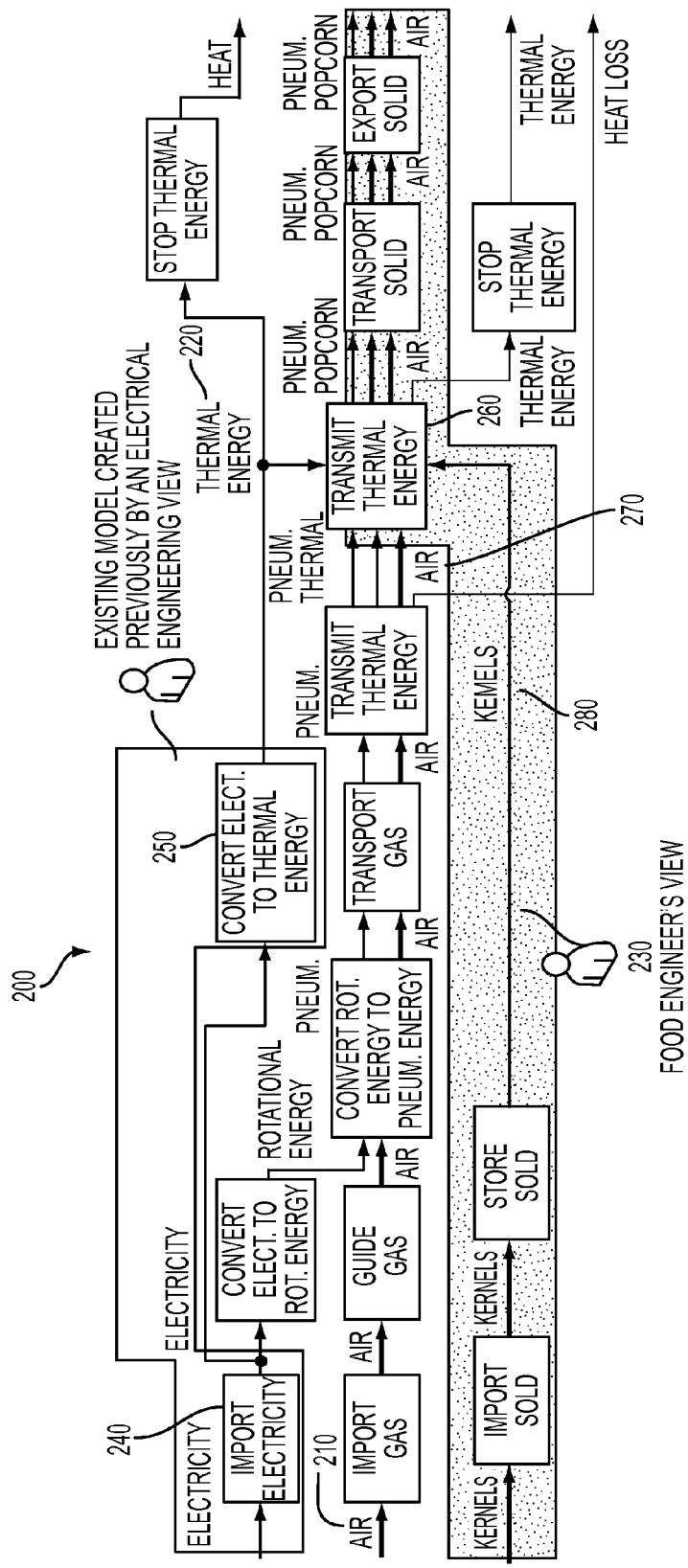
FIG. 2 illustrates a functional block diagram of an exemplary process.

A functional model 200 of a popcorn machine, shown in FIG. 2, is used to illustrate the technique. From the material (air 210) and energy (thermal energy 220) flows and functions it is clear that the design intention is to pop corn kernels with hot air rather than oil. At the early design stages, the domain engineers can create engineering views on the functional model to highlight the areas of responsibility and auto-generate simulation models that allow them to concentrate on their problem. These views indicate to the synthesizer that the engineer is trying to isolate its subsystem from the rest of the system for detailed design.

Reusing pre-existing system-level model components is possible thanks to the availability of academic and commercial libraries. However, the components themselves are not sufficient for automatic synthesis. It is very important to define the level of component granularity required by the synthesizer to generate correct simulation models. For example, each Modelica component defines both the structure (i.e. a capacitor) and its dynamic behavior using differential equations and algorithms $$\left(\text{e.g., } I(t) = C \frac{dV(t)}{dt}\right).$$

Additionally, a component's connectors (or ports) specify the equations to honor energy conservation principles (e.g. Kirchhoff Law's) in terms of potential and flow variables equivalent to voltage and current in the electrical domain, angular velocity and torque in rotational mechanics, and pressure and flow rate in hydraulics. Finally, components have an annotation field that can be used to store information about the component such as its documentation or icon.

In the present work, the namespace of the component in a library is used to classify its domain (e.g. Modelica.Electrical.Analog.Basic, Modelica.Mechanics.Components) and to locate the component (e.g. Resistor, Damper). Since the synthesizer works at the component level, the equations and algorithms associated with the component are never modified. However, the number of equations and number of statements are two important metrics that have to be available to the synthesizer when generating a minimal simulation model.

The objective of the synthesizer is to generate a satisfactory solution to the rest of the functional model (components that are not in the engineering view) to provide a complete but minimal simulation model for the component under design. A "minimal" simulation model is defined as a functionally correct model that requires the least number of simulation components and/or mathematical equations. For example, FIG. 2 shows a view 230 created by a food engineer highlighting the functions for which a more detailed model will be defined. In a graphical functional modeling editor, views can be implemented through the selection of functions and flows and grouping.

The types of the connectors in a component are used to determine the correct physical interface and generate compliant simulation models. Connector types are also useful to generate the energy conservation laws when a recycle function relates various components. A component's annotation field can be used as the means to associate and store the mappings of components-to-functions. Given the required level of component granularity, the presently described synthesizer uses a Modelica language parser to import the library and builds an abstract syntax tree to access a component's connectors, equations, algorithms, and annotations during code generation.

Figure 3:
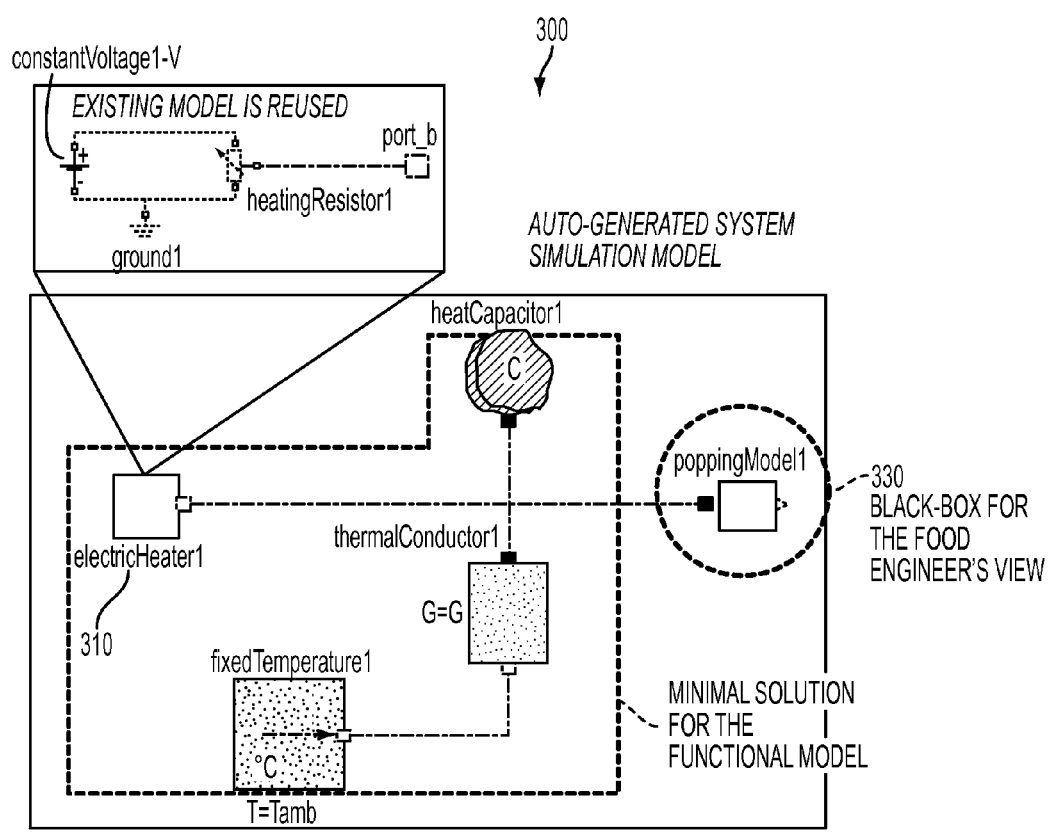
FIG. 3 illustrates a minimum system simulation model generated from the functional block diagram of FIG. 2.

The synthesizer then creates a black box component 330 (FIG. 3) for the food engineer's view 230 in FIG. 2 and finds a satisfactory minimal solution 300 for the remaining functions while taking into account reusability of existing system simulation models. Generating a minimal solution is important because fewer equations produce faster simulations and therefore increases the productivity of the engineers. Notice that the "electricHeater1" component 310 in FIG. 3 is a reusable component that was probably created using a view created by the electrical engineer for the "import electricity" function 240 and "convert electricity to thermal energy" function 250 shown in FIG. 2. If the "electricalHeater1" model was not yet available, the synthesizer would then select a primitive simulation component whose function is to "transmit thermal energy." This iterative design process adheres to systems engineering practice and the presently disclosed synthesis method enables concurrent systems engineering because it maintains all models synchronized to the latest functional system specifications while allowing multiple engineers from different disciplines to develop subsystems concurrently.

Figure 4:
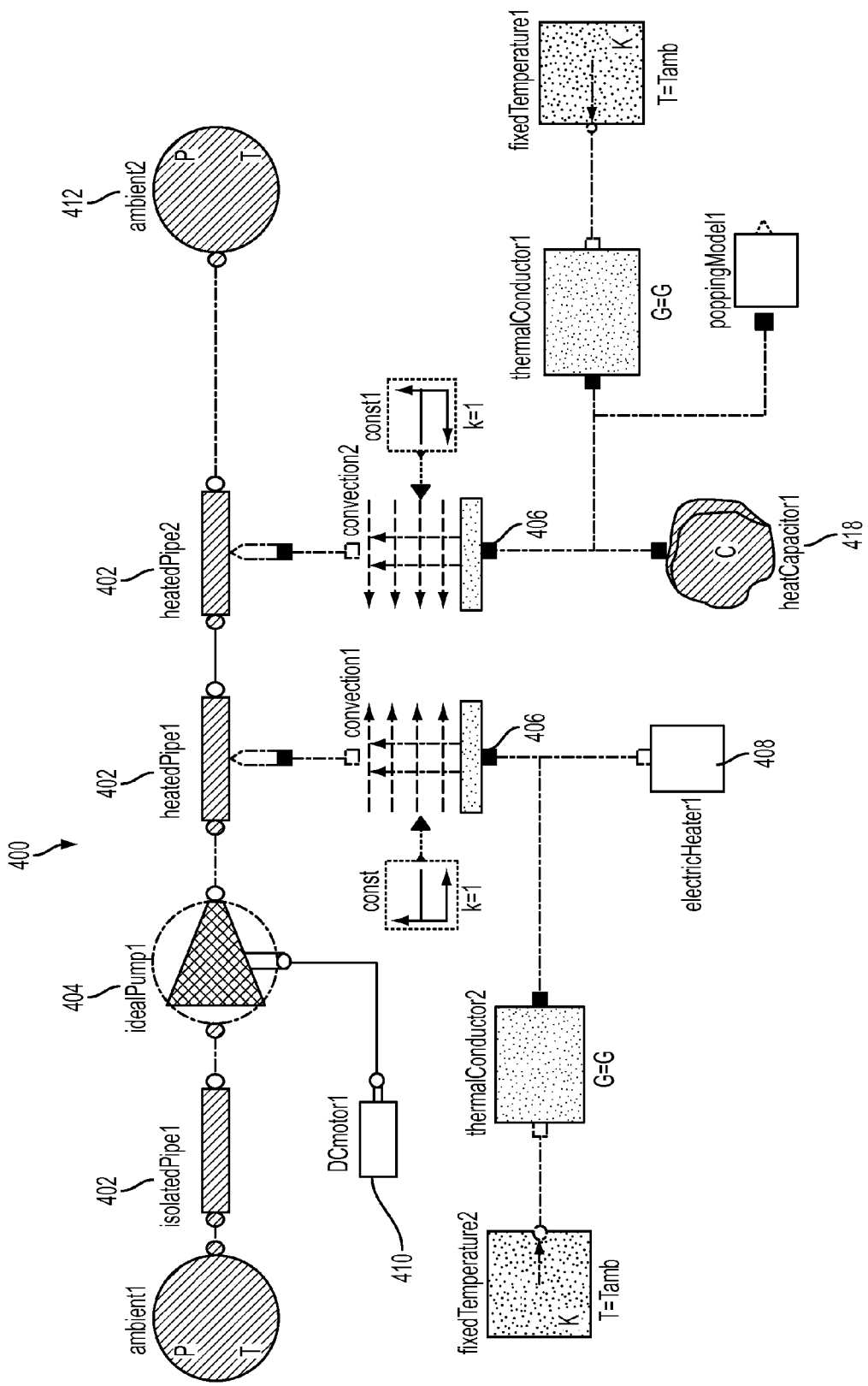
FIG. 4 illustrates a system-level simulation model generated by direct mapping from the functional block diagram of FIG. 2.

A complete system simulation can be auto-generated using the same synthesis process while taking into consideration the entire view of the functional model. A direct mapping of the functional model to components yields a detailed and correct system simulation model 400 that includes thermal elements (pipes 402, pump 404, convection blocks 406), electrical elements (electric heater block 408), and mechanical elements (DC motor block 410), as shown in FIG. 4. Notice that the synthesizer correctly infers the design intentions of a hot air popcorn machine and selects a pump, pipe, and convection components to simulate the air flow and the thermal energy transfer to the air flow to cook the kernels. This detailed model solves the functional model, but not efficiently because the air is imported, heated, used to heat the kernels, and it finally bleeds into the environment 412. An engineer looking at the functional model would "know" that a better design would be one that recycles the hot air. That point illustrates the importance of non-functional requirements. A non-functional requirement is a constraint to which the system must adhere, whether it be weight, geometry, reliability, computing power, etc. In the present example, the simulation model satisfies the functional model, but it is likely that the design is incapable of achieving a sufficient temperature to pop the kernels. Here, the oven temperature is a non-functional requirement. This demonstrates that functional models are inherently incomplete and do not provide sufficient information to reliably generate efficient designs. The presently disclosed synthesis approach attempts to compensate for the lack of information in functional models by inferring the context of the design and applying engineering intuition rules to create more reliable designs.

Fundamentally, a functional model is created to satisfy functional requirements (what the system is supposed to do) and it does not contain any information regarding the non-functional requirements. However, to overcome those limitations, a context-sensitive synthesis algorithm is presently disclosed that infers the missing information from functional models to generate high-quality simulation models based on the following key observations. First, feedback flows and "recycle" functions are necessary in a functional model for synthesizing efficient designs that are comparable in quality to designs created by experts. Interestingly, the existing work on functional modeling does not emphasize the importance of feedbacks (or loops) in the modeling practice and it is very rare to find any feedback in functional models. Feedback loops are critical for synthesizing models with sensors and actuators, which are essential components in modern cyber-physical systems. In addition, with more functionality being realized by software, feedback information is essential to the design of closed-loop control systems. A technique for finding feedback flows in incomplete functional models to improve the system-level model synthesis is further developed below.

Second, merely defining function-to-component relations is not sufficient during system-level synthesis. Traditionally, components realize functions and this creates a relationship between functions and components. Because many components can realize the same function (and vice-versa), however, without knowledge of the input/output flows of a function, there is no context in which to generate the correct component. For example, in FIG. 2, the function "transmit thermal energy" block 260 can be realized by any of several simulation components. However, in the example functional model 200, it is contextualized by its surrounding flows. The thermal energy flow entering the "transmit thermal energy" block 260 is coupled with an air flow 270. That suggests that convection is the appropriate heat transfer mechanism. The other material flow that enters the "transmit thermal energy" block is the popcorn flow 280. As it is not coupled with the thermal energy flow, it can be seen as the recipient of the thermal energy, and therefore necessitates the addition of a heat capacitor 414 in the simulation model 400 (FIG. 4). This flow-based contextualization allows for robust synthesis of complex systems.

Figure 5:
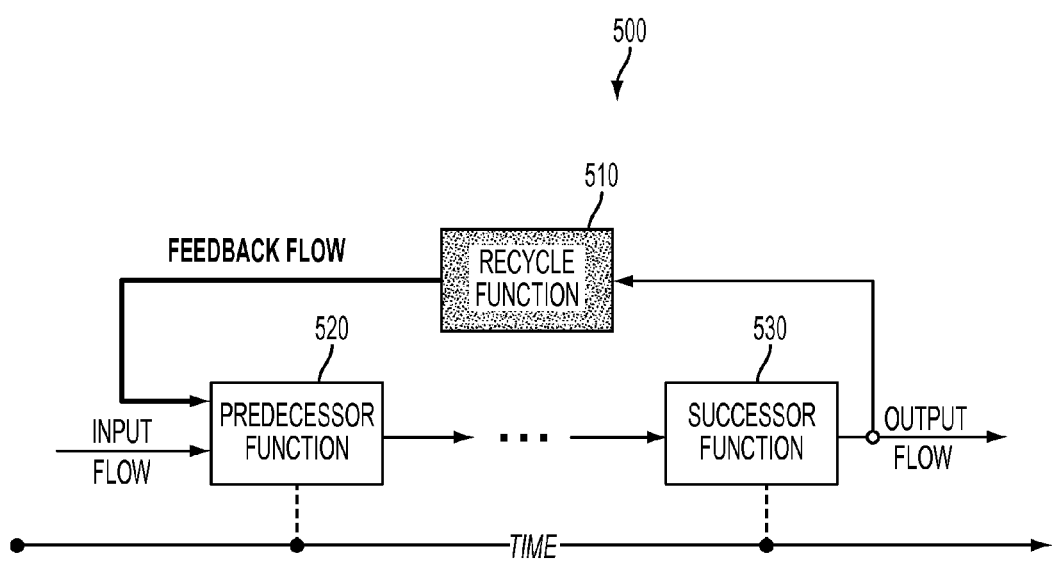
FIG. 5 is a semantic diagram of a recycle function according to an embodiment of the present invention.

The presently disclosed method improves upon the initial approach by implementing these observations. Most functional models lack feedback information because, in principle, a function is a process applied to an input flow to produce an output flow. Similarly, the entire system is seen as a black-box function that applies a process to its inputs to produce outputs. When the functional model without feedback is being transformed into a system-level simulation, the presently disclosed synthesizer applies design rules on specific flows that are relevant to the design and creates feedbacks of flows with the help of a new function type "recycle." The syntax and semantics of the proposed "recycle" function relative to the functional basis language are shown in FIG. 5. The "recycle" function 510 syntactically feeds back a flow produced by a function 530 to a predecessor function 520, defined as a function executed earlier in time in a chronological execution. The "recycle" function semantics define the reuse or returning of material, energy, or signal flow to a predecessor function. The selection of flows for the creation of feedbacks is a very important design objective. In one embodiment, the presently disclosed technique utilizes general design and engineering rules created by the engineers to create feedback loops in functional models. In another embodiment, various feedback flow alternatives are selected automatically, different models are generated for the alternatives, and the user is provided with all the design alternatives for further testing and trade-off analysis.

The "best" feedback flow alternative may be selected automatically by evaluating certain characteristics of the different models generated using the various feedback flow alternatives. The characteristics might include, for example, minimizing a weight or a cost, maximizing performance, reducing a length or improving performance. Engineering rules developed a priori may be used in evaluating characteristic values of each cyber-physical system modeled by a generated simulation model, and arriving at the optimum feedback flow alternative.

In order to reliably generate high-quality simulation models, every function within the functional model must be put into context to be correctly mapped to its respective simulation component(s). As previously stated, each function can be realized by an indefinite number of simulation components, and each simulation component can realize indefinite number of functions. To find the correct function-to-component mapping for a given model, each function must be contextualized by its input and output flows. There are two types of flows for every function. Primary flows are flows that are inherent to a given function (e.g., thermal energy flow in a "transmit thermal energy" block, or air flow in a "transport gas" block). As primary flows are fixed for every function, they add no new information to the system. Therefore, for flow contextualization, the presently described technique relies on secondary flows. Secondary flows are the non-essential inputs/outputs of a function (e.g. air flow in a "transmit thermal energy" block). Secondary flows help specify mechanisms that functions use, and reduce the n-to-m function-to-component relation down to a 1-to-1 mapping.

The presently described synthesizer uses primary and secondary flows to build a context tree data structure that can be used to infer a design context and drive the mapping of functions to concrete components. One context tree is built for every function in a functional model during synthesis. The root of the context tree is the function signature, or combination of the function and primary input and output flows. Secondary input and output flows are added as internal nodes. Leaf nodes represent the function's realization mechanism deduced from basic engineering knowledge and the context given by the root node and the secondary flows. For example, given the function signature "transmit thermal energy" from a "solid" to a "solid," the most effective realization mechanism for heat transfer is "conduction."

Figure 6:
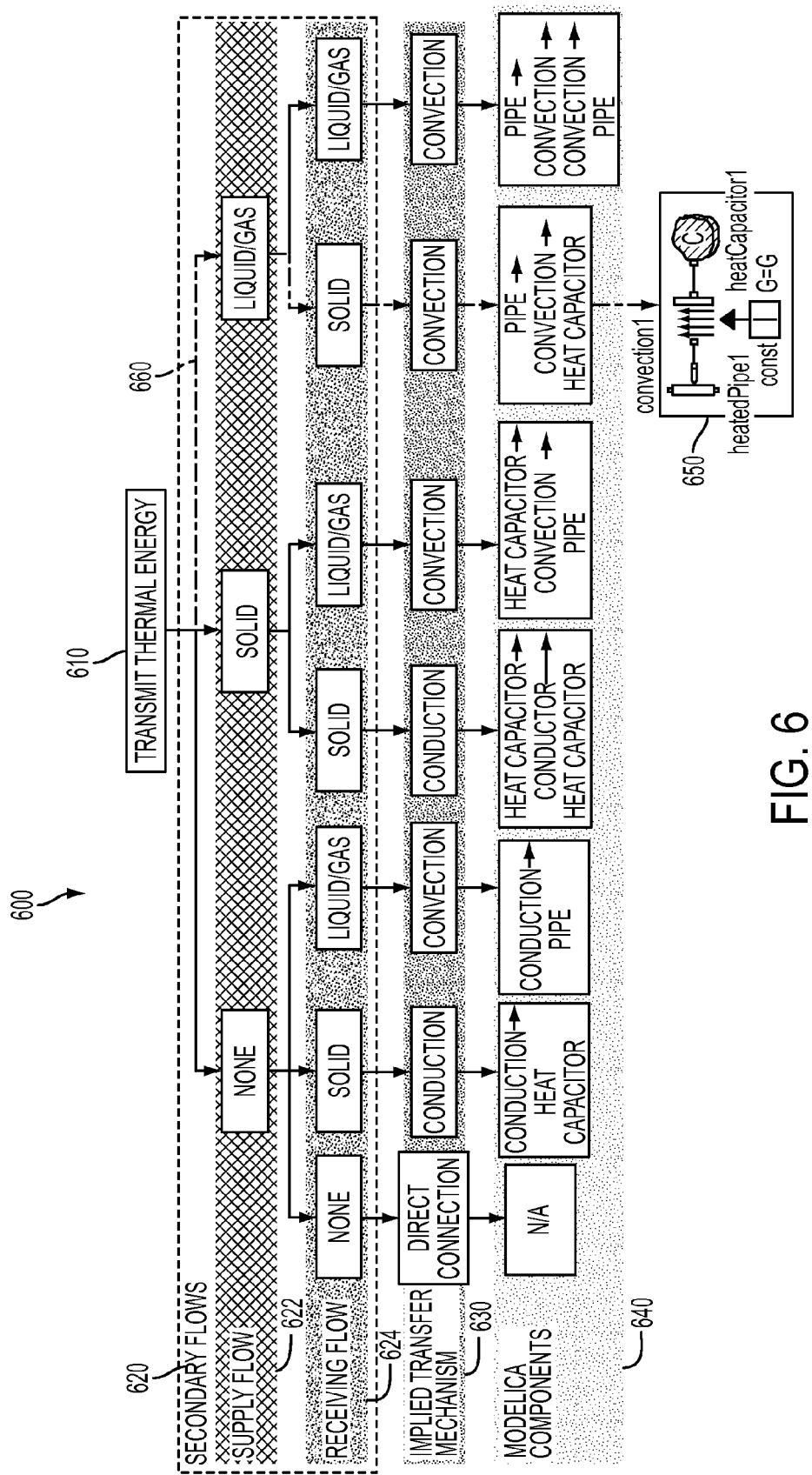
FIG. 6 is a representation of a context tree for the function "transmit thermal energy" in accordance with an embodiment of the present invention.

The contextualization of the "transmit thermal energy" function block using its secondary flows is demonstrated by the context tree 600 of FIG. 6, continuing the example of the popcorn machine. Secondary flows 620 within the "transmit thermal energy" function 610 are separated into supplying flows 622 and receiving flows 624. The supplying flow 622 is linked with the primary flow prior to the function, while the receiving flow is not. By following the context tree, the synthesizer is able to infer an implied transfer mechanism 630 to identify the correct components 640 needed to realize the function. The arrows inside the Modelica Component blocks 640 indicate the direction of the heat flow within the component set. A schematic 650 of the connected component set is shown beneath the path 660 chosen for the model.

Figure 7:
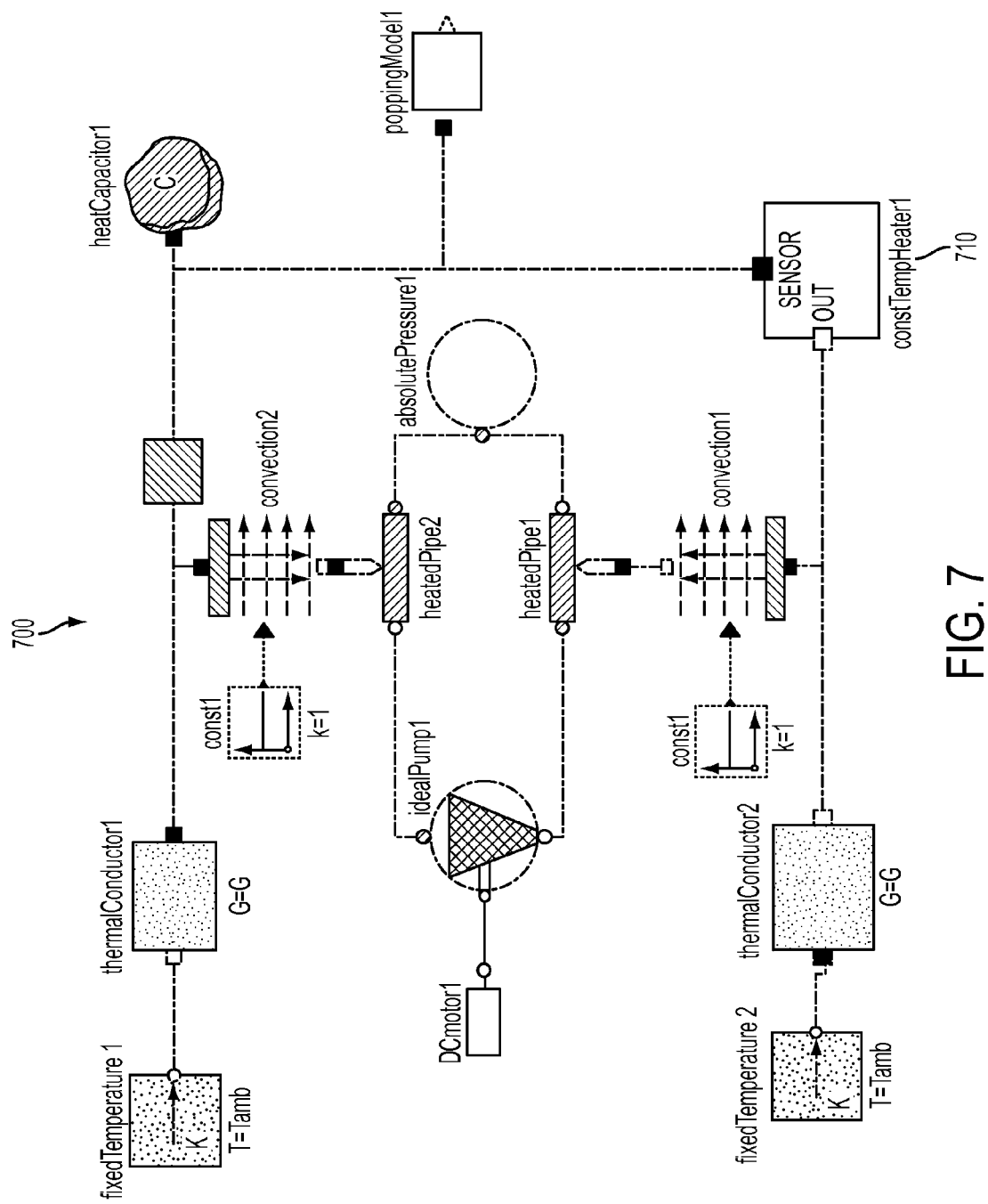
FIG. 7 illustrates another system-level simulation model generated by direct mapping from the functional block diagram of FIG. 2.

The resulting system simulation model 700 generated by the context-sensitive method is shown in FIG. 7. The main difference with respect to the model 400 of FIG. 4 is that this model recycles the hot air and it is used to optimize the cooking time and the energy consumption of the machine. Note that the open system of FIG. 4 (the "ambient1" and "ambient2" components) is now closed in FIG. 7 by the "absolutePressure1" component. The presently described synthesizer is therefore able to infer structure by creating a feedback flow and inserting a "recycle" function in the functional model to keep "hot air" within the machine instead of allowing it to escape to the environment. Using this model, the system minimizes the amount of thermal energy flow leaving the system, therefore decreasing the energy use and reducing cooking time.

In addition to adding a feedback flow for the hot air, the generated new model uses a signal feedback flow to create a simple control law to maintain a constant temperature, as can be seen in the simulation block 710 "constTempHeater1" an existing model whose output is heat, and whose inputs are electricity and a temperature sensor. Using a simple on-off controller, the heater attempts to maintain the cooking area at the ideal temperature, as determined by the engineer. This addition further increases the model's efficiency as well as the quality of the popcorn.

The popcorn electromechanical machine exhibits complex physical behaviors in the electrical, thermal, mechanical, and fluid domains that need to be precisely regulated and controlled by software and communication. Such behaviors are common to many next-generation CPS applications (e.g. nano-/micro-scale implantable medical devices) and it is therefore submitted that the presently described methodology is applicable for the design of a broad range of emerging CPS applications.

Synthesis Tool Implementation and Evaluation

Figure 8:
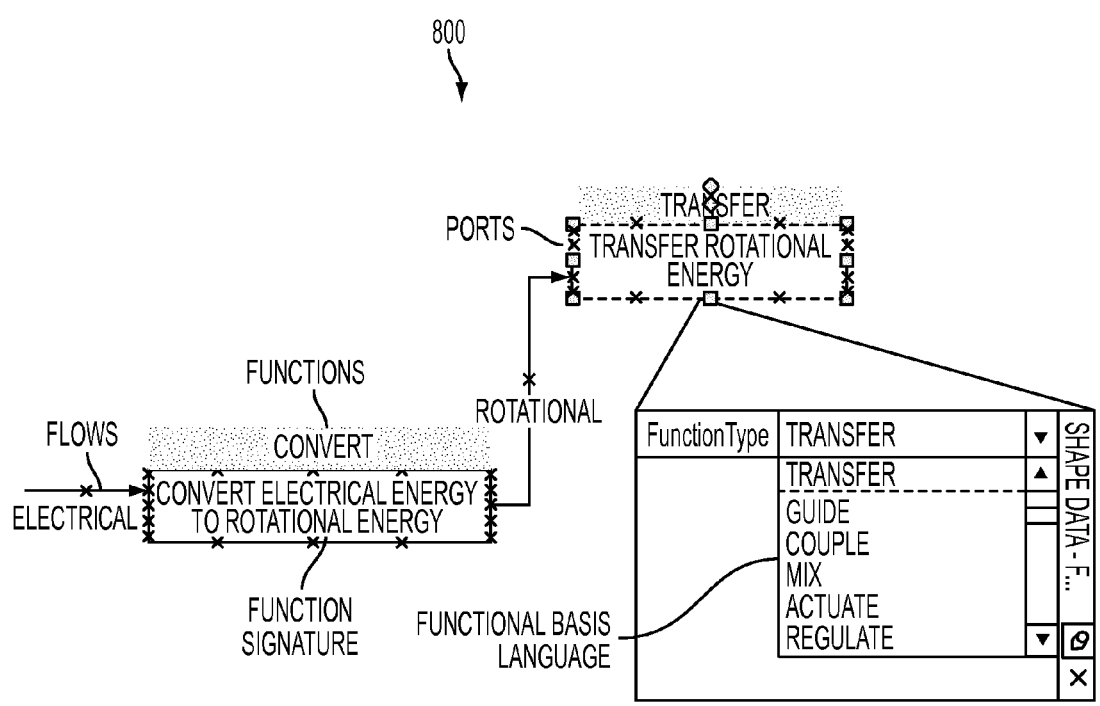
FIG. 8 is a screenshot of a functional model editor in accordance with an embodiment of the present invention.

The tool implementation comprises two parts: a functional model editor, and a system simulation synthesizer. The functional model editor is a graphical editing tool fully compliant with the Functional Basis language distributed to the users as a Microsoft Visio stencil. Some of the features in an example functional editor 800 are shown in FIG. 8. The functional editor features include drag and drop modeling, function signatures for readability, ports to connect functions, flow auto-routing and function and flow type selection based on menus. The models created with the functional editor are the input for the synthesizer. The functional editor is also capable of exporting the functional model as a matrix for compatibility with other concept design tools such as MEMIC v2.2.

The implemented synthesizer converts functional models into Modelica system-level simulation models. Modelica was selected because it is an open modeling language and the Modelica Standard Library (MSL) provides more than 1200 models of various engineering domains including electrical, fluid, mechanics, thermal, and state machines. The context tree 600 of FIG. 6 illustrates a mapping of a few MSL components to the "transmit thermal energy" function that the synthesizer uses. Note that the functions-to-components mapping corresponds to explicit function-structure (F-S) relations in the FBS methodology and implicit function-behavior (F-B) relations because the MSL components already provide structure-behavior (S-B) relations as each component includes a mathematical description that defines its dynamic behavior. Thus, when F-S relations are directly created during the mapping, the F-B relations are indirectly created thanks to the existing S-B relations provided by the MSL. Adding support for other system simulation languages such as Simscape would require a new mapping of functions-to-components for the target language.

Figure 9:
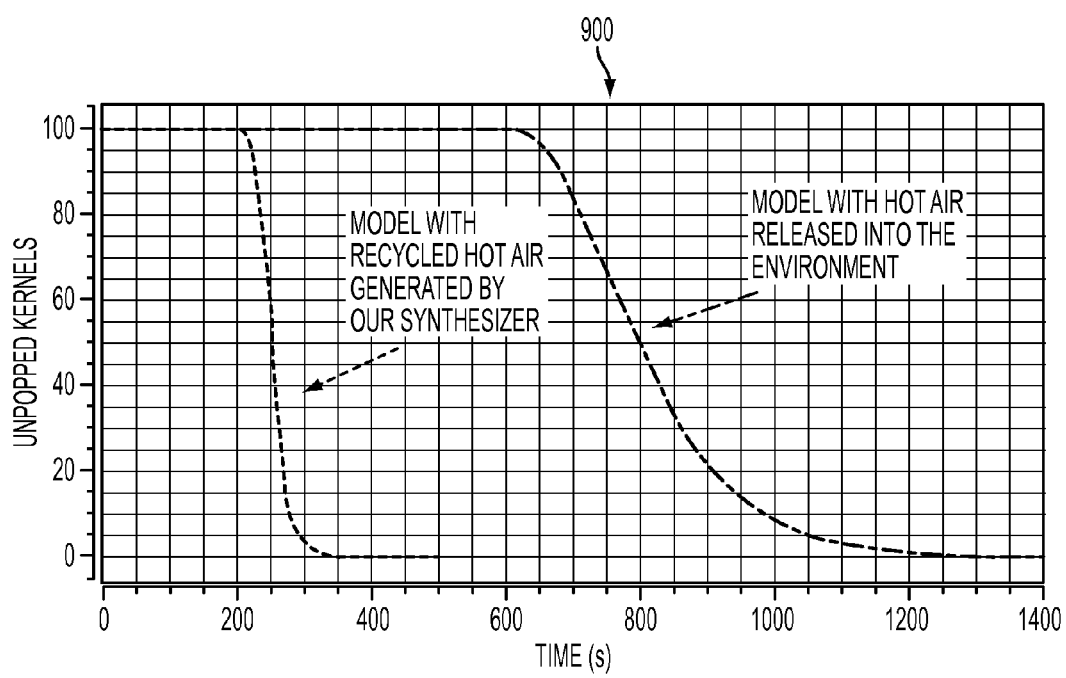
FIG. 9 is a chart showing the performance of example electromechanical systems with and without a "recycle" function.

The chart 900 of FIG. 9 shows that the context-sensitive synthesis approach improves the quality of the generated models for the popcorn machine example. Popcorn popping occurs when the internal kernel temperature reaches 180-190 deg. C. Using a dynamic model of popcorn popping and 100 kernels, the simulation results show that the model recycling hot air achieves a higher popping rate and significantly less cooking time than the model that bleeds hot air into the environment. While both designs (mode) 400 of FIG. 4 and model 700 of FIG. 7) are correct and accomplish the same functionality, when the synthesizer creates a feedback flow for the hot air the resulting model is three times more efficient at cooking popcorn than the model generated without considering the feedback flows. In the embodiment used in the present implementation, the user selects feedback flows based on design rules. In the particular example of the popcorn machine, the design rule specifies that any function "export gas" bleeding hot air into the environment is compatible with any predecessor function "transmit thermal energy" that transmits heat to a gas.

Figure 10:
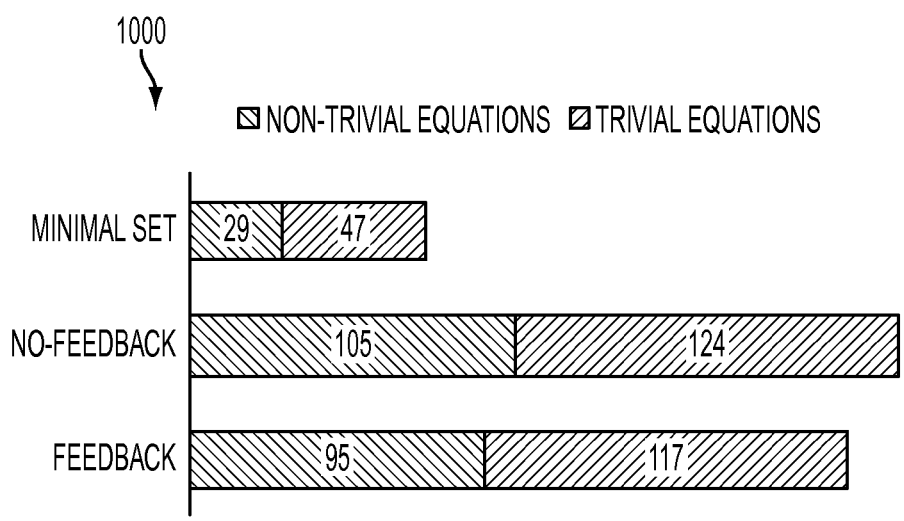
FIG. 10 is a chart comparing the complexity of simulation models generated from a functional model.

One important aspect of the context-sensitive approach is generating a minimal system simulation model that provides the correct inputs to the subsystem under design. The complexities of the generated models for the popcorn machine example are illustrated in FIG. 10. The minimal simulation model (Minimal Set) comprise 29 non-trivial equations and it is more than three times smaller than the two complete system-level models. The performance of the simulation is directly proportional to the number of equations in the model and therefore it is important to provide small hut correct models when developing subsystems to reduce development time.

Synthesis Algorithm

A proposed synthesis algorithm, presented in FIG. 11, has the following required inputs: a functional model and a library of system level simulation components. In the presently described synthesizer, the functional model is a labeled directed graph $G=(V,E,L_V,L_E)$, where V is a set of nodes or functions, E is a set of edges or flows, $L_V$ is a set of function labels, and $L_E$ is a set of flow labels. Each function v∈V and each flow e∈E have uniquely assigned labels $l(v){\in}L_V$ and $l(e){\in}L_E$ using the vocabulary from the Functional Basis language and the newly introduced "recycle" function label. For example, a function w with l(w)=transmit and an inbound flow f with l(f)=thermal energy represents a "transmit thermal energy" function signature. The component simulation library $\mathcal{L}$ is parsed into a queryable abstract syntax tree AST that, given a set of functions and flows $Q \subset G$, returns a list of components $\mathcal{K} \in \mathcal{L}$ that map to Q according to the function-structure relations.

Optionally, the user may provide an engineering view $\mathcal{W}$ and/or recycle function rules $\mathcal{R}$ in the form described by D. L. Rosenband, Hardware synthesis from guarded atomic actions with performance specifications, In Proc. of the 2005 IEEE/ACM International conference on Computer-aided design, ICCAD 2005, pages 784-791 (2005), the contents of which is incorporated by reference herein. The first step (Line 2) is to parse the library into an abstract syntax tree where equations, algorithms, connectors, and annotations are accessible for the algorithm. If the user provides an engineering view $\mathcal{W}$ (Line 3), the algorithm synthesizes a minimal simulation model without context trees in order to reduce the number of components. Since the engineering view represents the subsystem under design, the functions covered by the view are mapped into a single empty black-box component B with a well-defined interface derived from the input and output flows to/from $\mathcal{W}$ in the functional model. The remainder of the functions RESIDUAL (functions that are not in the view) are mapped to components. In the case where a function maps to multiple components, the algorithm picks the component with the least number of equations and the least number of statements in the component's algorithm in order to synthesize a minimal simulation model for the CPS.

When synthesizing the entire functional model (without engineering views in Line 14), the functional model is traversed one function at a time and one context tree T is built for each function. Based on the context given by the function's signature (root node) and the secondary input/output flows (inner nodes), the realization mechanism is deduced from basic engineering principles and added as the leaf nodes. The context tree is then traversed (starting at the root) to create a path $P_i$ according to the existing secondary flows and the appropriate realization mechanism. This path represents the flow-based contextualized function and all the functions and flows in $P_i$ are mapped to components from the library, thus creating the most appropriate design INFERREDDESIGN. If recycle function rules $\mathcal{R}$ are provided, the last step attempts to create feedback loops in the functional and simulation models. When a recycle rule matches the functional model (Line 24), a feedback is created in both the functional model and in the mapped simulation model. It is very important to guarantee that energy conservation laws are preserved when creating a feedback loop in the simulation model. The rest of the algorithm checks the domain of the source and destination components to generate the appropriate energy conservation equations using potential-flow variables to interface the components associated with the feedback loop.

System

Figure 12:
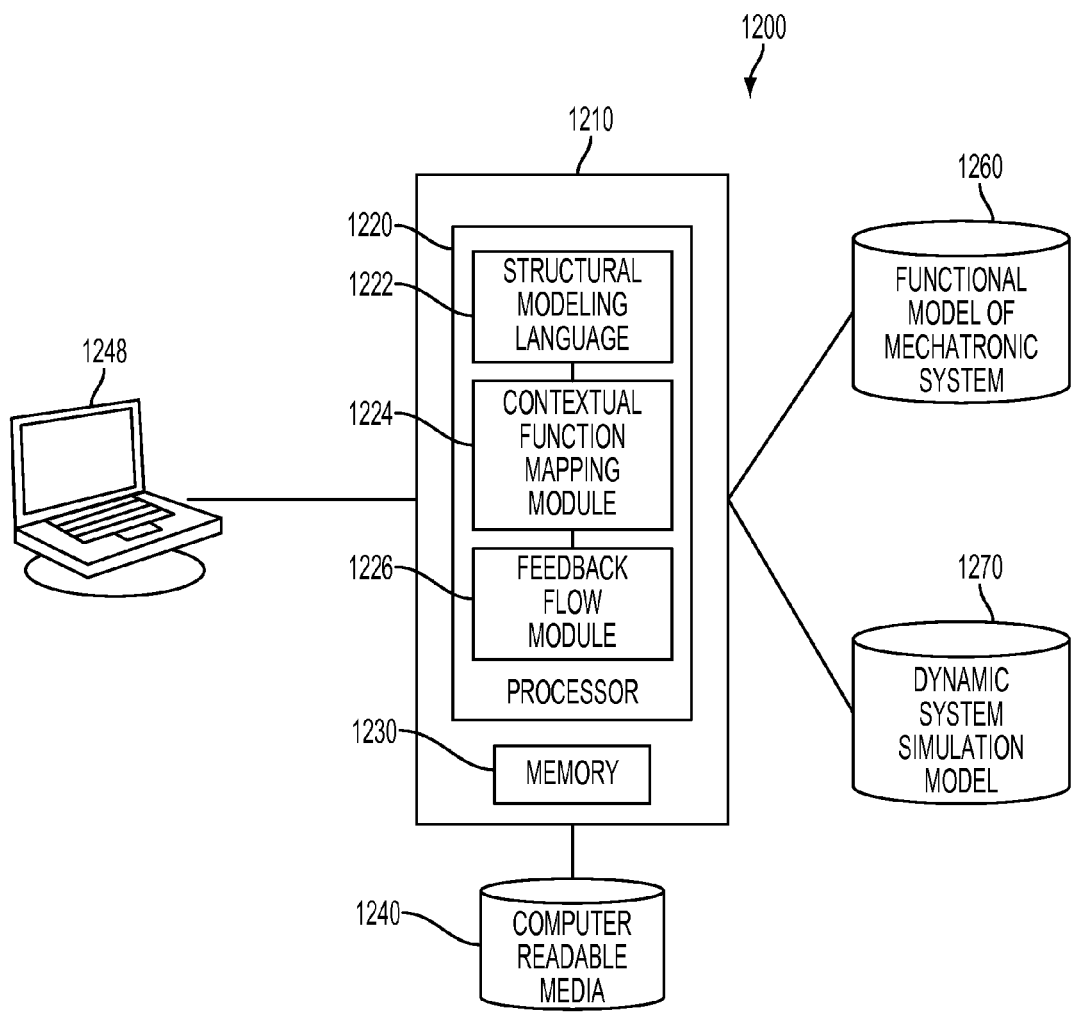
FIG. 12 is a schematic diagram of an exemplary system used in performing the method of the invention.

The elements of the methodology as described above may be implemented in a computer system comprising a single unit or a plurality of units linked by a network or a bus. An exemplary system 1200 is shown in FIG. 12.

A computing apparatus 1210 may be a mainframe computer, a desktop or laptop computer or any other device or group of devices capable of processing data. The computing apparatus 1210 receives data from any number of data sources that may be connected to the apparatus. For example, the computing apparatus 1210 may receive input from a user via an input/output device 1248, such as a computer or a computing terminal. The input/output device includes an input that may be a mouse, network interface, touch screen, etc., and an output that may be a visual display screen, a printer, etc. Input/output data may be passed between the computing apparatus 1210 and the input/output device 1248 via a wide area network such as the Internet, via a local area network or via a direct bus connection. The computing apparatus 1210 may be configured to operate and display information by using, e.g., the input/output device 1248 to execute certain tasks. In one embodiment, synthesizing a simulation model is initiated via the input/output device 1248, and simulation results are displayed to the user via the same device.

The computing apparatus 1210 includes one or more processors 1220 such as a central processing unit (CPU) and further includes a memory 1230. The processor 1220, when configured using software according to the present disclosure, includes modules that are configured for performing one or more methods for synthesizing a simulation model of a cyber-physical system, based on a functional model of the cyber-physical system, as discussed herein. Those modules may include a structural modeling language module 1222 that is used in creating the simulation model 1270.

The modules may also include a contextual function mapping module 1024 that maps functions of the functional model 1260 to components of the simulation model 1270 based in part on context in the functional model, as described above. Additionally, a feedback flow module 1226 may reside in the processor 1020 for identifying locations for feedback flow in the functional model 1260, and adding a recycle function to that model. Additional modules to perform additional operations as described above may be incorporated in the processor 1220.

The memory 1230 may include a random access memory (RAM) and a read-only memory (ROM). The memory may also include removable media such as a disk drive, tape drive, memory card, etc., or a combination thereof. The RAM functions as a data memory that stores data used during execution of programs in the processor 1220; the RAM is also used as a program work area. The ROM functions as a program memory for storing a program executed in the processor 1220. The program may reside on the ROM or on any other tangible or non-volatile computer-readable media 1240 as computer readable instructions stored thereon for execution by the processor to perform the methods of the invention. The ROM may also contain data for use by the program or by other programs.

Generally, the modules 1222, 1224, 1226 described above include routines, objects, components, data structures and the like that perform particular tasks or implement particular abstract data types. The term "program" as used herein may connote a single program module or multiple program modules acting in concert. The disclosure may be implemented on a variety of types of computers, including personal computers (PCs), hand-held devices, multi-processor systems, microprocessor-based programmable consumer electronics, network PCs, mini-computers, mainframe computers and the like. The disclosed technique may also be employed in distributed computing environments, where tasks are performed by remote processing devices that are linked through a communications network. In a distributed computing environment, modules may be located in both local and remote memory storage devices.

An exemplary processing module for implementing the methodology above may be hardwired or stored in a separate memory that is read into a main memory of a processor or a plurality of processors from a computer readable medium such as a ROM or other type of hard magnetic drive, optical storage, tape or flash memory. In the case of a program stored in a memory media, execution of sequences of instructions in the module causes the processor to perform the process steps described herein. The embodiments of the present disclosure are not limited to any specific combination of hardware and software and the computer program code required to implement the foregoing can be developed by a person of ordinary skill in the art.

The term "computer-readable medium" as employed herein refers to a tangible, non-transitory machine-encoded medium that provides or participates in providing instructions to one or more processors. For example, a computer-readable medium may be one or more optical or magnetic memory disks, flash drives and cards, a read-only memory or a random access memory such as a DRAM, which typically constitutes the main memory. The terms "tangible media" and "non-transitory media" each exclude propagated signals, which are not tangible and are not non-transitory. Cached information is considered to be stored on a computer-readable medium. Common expedients of computer-readable media are well-known in the art and need not be described in detail here.

CONCLUSION

The forgoing detailed description is to be understood as being in every respect illustrative and exemplary, but not restrictive, and the scope of the disclosure herein is not to be determined from the description, but rather from the claims as interpreted according to the full breadth permitted by the patent laws. It is to be understood that various modifications will be implemented by those skilled in the art, without departing from the scope and spirit of the disclosure.

What is claimed is:

1. A method for generating a simulation model of a cyber-physical system that performs control functionality in software to actuate and/or manipulate a defined industrial system, the method for generating the closed-loop simulation model based on a defined functional model of the cyber-physical system, the method comprising:
    by a processor, identifying input flows and output flows of a function included in the defined functional model of the cyber-physical system;
    by the processor, identifying as secondary flows those input flows and output flows of the function that are not essential flows required by the function;
    by the processor, using the secondary flows to determine a specific context for the mechanism of the function;
    by the processor, using the specific context determined by the secondary flows, selecting a simulation model component that maps to the function of the functional model by referring to a context tree having a root node corresponding to the function of the functional model and selecting the simulation model component with the least number of equations and the least number of statements; and
    repeating the above operations on additional functions included in the defined functional model to incorporate additional simulation model components into the simulation model;
    forming a resulting system simulation model of the industrial system;
    executing the resulting simulation model based upon industrial system input flows supplied by a user;
    displaying simulation results in the form of industrial system output flows on a computer terminal display associated with the user; and
    actuating and/or manipulating the defined industrial system based upon the simulation results.

2. A method as in claim 1, wherein branch nodes of the context tree correspond to the secondary flows of the function, and leaf nodes of the context tree correspond to the simulation model components.

3. A method as in claim 2, wherein the branch nodes of the context tree corresponding to the secondary flows of the function are separated into receiving flows and supplying flows.

4. A method as in claim 1, further comprising:
    inserting a recycle function in the functional model to return one of a material, an energy flow or a signal to a predecessor function.

5. A method as in claim 4, further comprising:
    recognizing a flow out of the cyber-physical system, and wherein inserting the recycle function feeds the flow back to the predecessor function.

6. A method as in claim 4, further comprising:
    by the processor, inserting the recycle function at a location in the functional model;
    for a resulting functional model containing the recycle function at the location, generating a corresponding simulation model;
    repeating the inserting and the generating for a plurality of locations; and
    presenting a plurality of alternative corresponding simulation models to a user.

7. A method as in claim 4, wherein a location for inserting the recycle function in the functional model is manually selected.

8. A method as in claim 4, further comprising:
    by the processor, inserting the recycle function at a location in the functional model;
    for a resulting functional model containing the recycle function at the location, generating a corresponding simulation model;

computing a characteristic value of a cyber-physical system modeled by the corresponding simulation model;

repeating the inserting, the generating and the computing for a plurality of locations to generate a plurality of simulation models and characteristic values; and choosing a simulation model from the plurality of simulation models based on the characteristic value.

9. A method as in claim 8, wherein the characteristics are compared using at least one engineering rule.

10. A method as in claim 4, wherein the recycle function returns a signal to a predecessor function, and creates a control law.

11. A method as in claim 10, wherein the control law implements a feedback controller.

12. A non-transitory computer-usable medium having computer readable instructions stored thereon that, when executed by a processor, cause the processor to perform operations for generating synthesizing a simulation model of a cyber-physical system that performs control functionality in software to actuate and/or manipulate a defined industrial system, the method for generating the closed-loop simulation model based on a defined functional model of a cyber-physical system, the operations comprising:

identifying input flows and output flows of a function included in the defined functional model of the cyber-physical system;

identifying as secondary flows those input flows and output flows of the function that are not essential flows required by the function;

using the secondary flows to select a specific context for the mechanism of the function;

using the specific context selected by the secondary flows, selecting a simulation model component that maps to the function of the functional model by referring to a context tree having a root node corresponding to the function of the functional model;

repeating the above operations on additional functions included in the defined functional model to incorporate additional simulation model components into the simulation model; and executing the final simulation model based upon industrial system input flows supplied by a user;

displaying simulation results in the form of industrial system output flows on a computer terminal display associated with the user; and actuating and/or manipulating the defined industrial system based upon the simulation results.

13. A non-transitory computer-usable medium as in claim 12, wherein branch nodes of the context tree correspond to the secondary flows of the function, and leaf nodes of the context tree correspond to the simulation model components.

14. A non-transitory computer-usable medium as in claim 13, wherein the branch nodes of the context tree corresponding to the secondary flows of the function are separated into receiving flows and supplying flows.

15. A non-transitory computer-usable medium as in claim 12, wherein the operations further comprise:

inserting a recycle function in the functional model to return one of a material, an energy flow or a signal to a predecessor function.

16. A non-transitory computer-usable medium as in claim 15, wherein the operations further comprise:

recognizing a flow out of the cyber-physical system, and wherein inserting the recycle function feeds the flow back to the predecessor function.

17. A non-transitory computer-usable medium as in claim 15, wherein the operations further comprise:

inserting the recycle function at a location in the functional model;

for a resulting functional model containing the recycle function at the location, generating a corresponding simulation model;

repeating the inserting and the generating for a plurality of locations; and presenting a plurality of alternative corresponding simulation models to a user.

18. A non-transitory computer-usable medium as in claim 15, wherein a location for inserting the recycle function in the functional model is manually selected.

19. A non-transitory computer-usable medium as in claim 15, wherein the operations further comprise:

inserting the recycle function at a location in the functional model;

for a resulting functional model containing the recycle function at the location, generating a corresponding simulation model;

computing a characteristic value of a cyber-physical system modeled by the corresponding simulation model;

repeating the inserting, the generating and the computing for a plurality of locations to generate a plurality of simulation models and characteristic values; and choosing a simulation model from the plurality of simulation models based on the characteristic value.

20. A non-transitory computer-usable medium as in claim 19, wherein the characteristics are compared using at least one engineering rule.

21. A non-transitory computer-usable medium as in claim 15, wherein the recycle function returns a signal to a predecessor function, and creates a control law.

22. A non-transitory computer-usable medium as in claim 21, wherein the control law implements a feedback controller.

* * * * *